United States Patent
Heid

(10) Patent No.: US 6,297,633 B1
(45) Date of Patent: Oct. 2, 2001

(54) MAGNETIC RESONANCE TONOGRAPHY SYSTEM WITH NON-UNIFORM BASIC FIELD MAGNET

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/450,291

(22) Filed: Nov. 29, 1999

(30) Foreign Application Priority Data

Nov. 30, 1998 (DE) .............................. 198 55 212

(51) Int. Cl.[7] ................................................ G01V 3/00
(52) U.S. Cl. ................................ 324/309; 324/307
(58) Field of Search .................................. 324/309, 307, 324/306, 314, 312, 300

(56) References Cited

U.S. PATENT DOCUMENTS 5,309,101 * 5/1994 Kim et al. .......................... 324/309
5,739,688 * 4/1998 Krieg .................................. 324/309

FOREIGN PATENT DOCUMENTS

OS 33 04 461    8/1984   (DE) .
0 399 789    11/1990   (EP) .

* cited by examiner

*Primary Examiner*—Louis Arana
(74) *Attorney, Agent, or Firm*—Schiff Hardin & Waite

(57) ABSTRACT

A magnetic resonance tomography system has gradient coils arranged in a basic field magnet, an RF transmission and reception coil as well as a drive and evaluation circuit, and the basic field magnet is designed exclusively without taking the field homogeneity into consideration, so that it produces a basic magnetic field having a field gradient $dB_0/du$ in the direction u in the scan volume that is smaller in the slice-selection direction and in the readout direction than a field gradient $G_u$ activated in the respective direction u with the respective gradient coils.

6 Claims, 1 Drawing Sheet

MAGNETIC RESONANCE TONOGRAPHY SYSTEM WITH NON-UNIFORM BASIC FIELD MAGNET

BACKGROUND OF THE INVENTION

1. Field of the Invention

The present invention is directed to a nuclear magnetic resonance tomography system of the type having gradient coils arranged in a basic field magnet, an RF transmission and reception coil, and a drive and evaluation circuit.

2. Description of the Prior Art

In all conventional magnetic resonance tomography systems, particular value is placed thereon making the magnetic field of the basic field magnet as uniform as possible in the scan volume, i.e. the volume roughly corresponding to a sphere having a diameter of 50 cm within which one strives to obtain an exact image. This volume is also referred to as the DSV (design shim volume). For example, a uniformity of less than 3 ppm required in the DSV. Achieving this uniformity, however, requires an extremely high outlay in the design of the basic field magnet, which is composed of a plurality of superconducting coils. Typically, six coils are required in order to achieve the uniformity cited above as an example.

However, European Application 0 399 789 discloses a magnetic resonance tomography apparatus that makes use of inhomogeneities of the basic magnetic field for imaging purposes. Gradients of the basic magnetic field on the order of 0.1 T/cm are thereby generated, these being superimposed with switched gradient fields having values of, typically, 0.2 T/cm.

German OS 33 04 461 discloses a magnetic resonance tomography apparatus wherein the homogeneity range of the basic magnetic field is less than the measuring field. The gradient field, however, proceeds monotonously over the entire measuring field, preferably increasing/decreasing linearly. A nuclear magnetic resonance tomogram thus exhibits less resolution in the edge region than in the central, diagnostically interpretable region.

SUMMARY OF THE INVENTION

An object of the present invention is to provide magnetic resonance tomography system which can be operated with a more simply constructed, and thus significantly less expensive, basic field magnet, without any noteworthy loss in the quality of the images obtained.

This object is inventively in a magnetic resonance tomography system having a basic field magnetic that is designed such without taking the absolute field uniformity into consideration, and which produces a basic field having a field gradient $dB_{0z}/du$ in the direction u in the scan volume that is smaller in the slice-selection direction and in the readout direction than a field gradient $G_u$ activated in these respective directions with the gradient coils.

The optimization of the magnet so that, instead of the absolute field deviations being taken into consideration, only the adherence to a maximum amount of the field gradient is sought, leads to a magnet structure that is significantly simplified; for example, a basic field magnet having two or three coils can be employed instead of a basic field magnet having six coils. The invention is based on the perception that the image creation, and thus the quality of the image, does not depend on the absolute field uniformity in the scan volume, but only how large the field gradient is. As long as the field gradient of the basic field magnet is smaller in the slice-selection direction and in the readout direction than the field gradient that can be maximally obtained with the gradient coils, unambiguity of the spatial resolution is assured, even though certain distortions may be present.

Optimum unambiguities, and thus optimum imaging conditions, are achieved in an embodiment of the invention wherein the field gradient $dB_{0z}/du$ of the basic field magnet is made smaller than the location error of the field gradient of the gradient coils. The location error generated by the field gradient of the basic magnetic field is thus small than the location error generated by unavoidable errors of the field gradient of the gradient coils.

Given employment of line-by-line K-sampling under a readout gradient, an image distortion occurs in the readout direction to the field inhomogeneity (the phasecoding directions, by contrast, are free of distortions). In order also to be able to correct greater distortions, i.e. frequency offsets, with post-processing, the receiver and sampling bandwidth are selected, according to a further embodiment of the invention, so that the regions of greatest $B_0$ inhomogeneity can still be received as well.

This can be achieved with respect to the sampling bandwidth in a further embodiment of the invention by oversampling of the time signal. The entire readout time derives from the desired resolution and the minimally achieved readout gradient, i.e. the gradient in the region where readout and field inhomogeneity gradient partially cancel.

It is also within the scope of the invention to calculate the Fourier transformation, which is employed for the date processing to produce an image in the evaluation circuit over the entire sampled time signal, and the image is distortion-corrected by interpolation with the pixel offset known from the field inhomogeneity curve.

DESCRIPTION OF THE PREFERRED EMBODIMENTS

Figure 1:
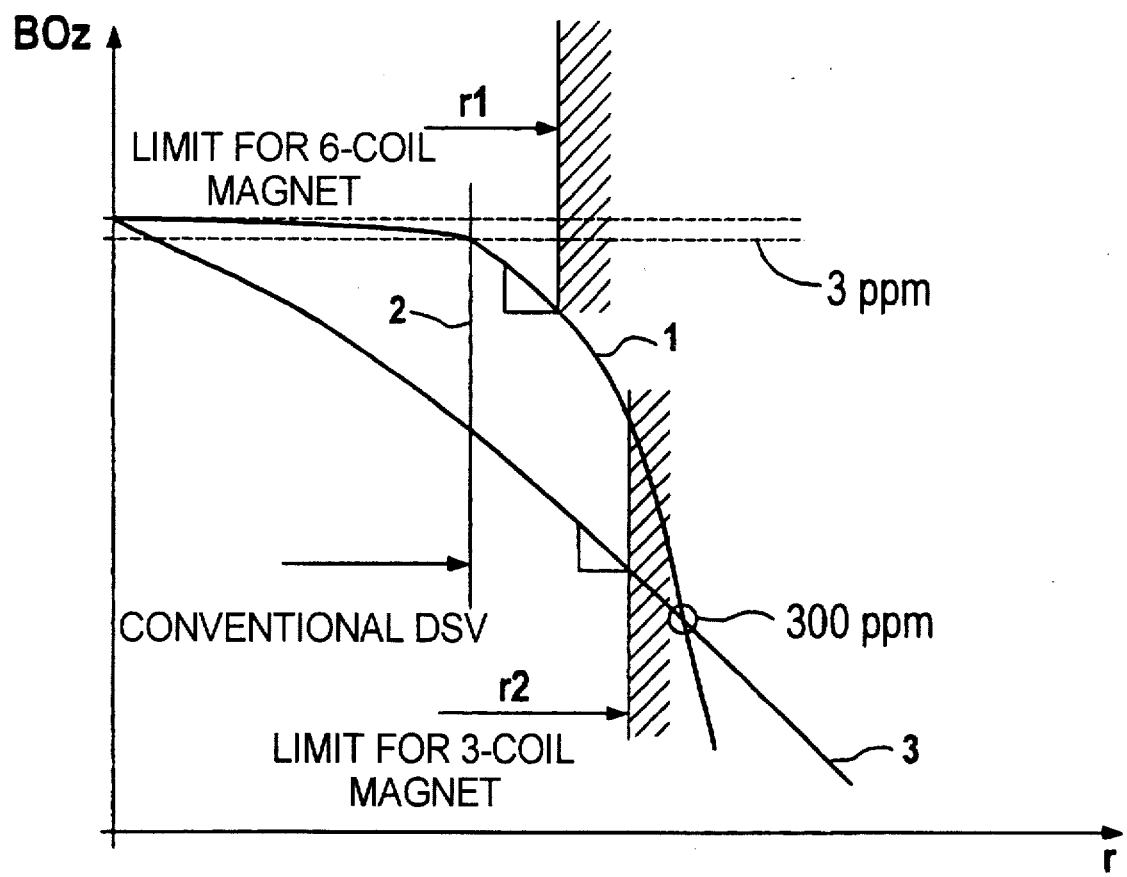
FIG. 1 schematically illustrates the curve of the magnetic field of the basic field magnet in a magnetic resonance tomography system according to the invention.

As already stated, a basic field magnet for a magnetic resonance tomography system is conventionally designed such that the field deviation in a spherical volume of, for example, 50 cm, which is referred to as the DSV, does not exceed a certain amount, for example 3 ppm. Only the component $B_{0z}$ in the principal direction of the magnetic field is thereby considered. The aforementioned homogeneity demand is currently generally met by basic field magnets having six individual coils. In FIG. 1, curve 1 shows the magnetic field curve over the radius for such a magnet. The limit of the DSV with a radius of 25 cm is referenced 2 in FIG. 1. The DSV "boundary" is defined in this case as the location at which basic magnetic field $B_{0z}$ has dropped by 3 ppm compared to the center of the magnet. A very smooth, i.e. uniform, magnetic field curve in the DSV is achieved by the complicated six-coil design, whereby the magnetic field drops steeply outside the DSV.

Given a conventional spin-WARP method, the spatial resolution, as is known, is based the production of a location dependency of the resonant frequency of the magnetic resonance signals due to location-dependent magnetic fields that are generated by switched gradients. This is utilized in a slice-selected excitation phase wherein in that only one slice, dependent on a slice selection gradient and on the frequency band of the excitation signal, is excited in the excitation phase. In a phase readout, location coding is required in two directions. The location coding in a first direction ensues on the basis of a phase-coding gradient that impresses a location-dependent phase on the nuclear magnetic resonance signals before the readout, which is modified in a number of steps. The spatial resolution in the second direction ensues by impressing a location-dependent frequency onto the nuclear magnetic resonance signals in the readout phase with a readout gradient.

Deviations of the magnetic field strength of the basic magnetic field $B_{0z}$ lead to an error in the location information. This, however, only applies to the slice selection phase and the readout phase, since only the differences between the phase-coding steps are determining factors in the phase coding, and thus magnetic field errors which are constant over time have no influence on the location coding.

Deviations of the basic magnetic field, however, are not the only source of magnetic field-produced location errors. Non-linearities of the gradient fields, which typically amount to 5 through 10%, are added thereto. Given an obtainable gradient strength of, for example, 20 mT/m, an error of, for example, 2 mT/m occurs. For a radius of 0.25 m, this yields a maximum field deviation of 0.5 mT. The demand of a maximum field deviation of 3 ppm usually made for the design of the basic field magnet and which is met only with great outlay, however, amounts to a maximum field deviation of 0.003 mT given a 1 T magnet.

The invention is based on the perception that it is not the field homogeneity per se but field gradients of the basic magnetic field that are critical for the spatial resolution, and thus for the imaging quality. It must merely be assured that the switched field gradients generated by the gradient coils are greater than the field gradients of the basic magnetic field. The vectorial sum of the field gradients present in the basic magnetic field and the field gradients generated by switched gradient coils must not change operational sign anywhere in the image frame, since ambiguities in the spatial resolution would otherwise arise. The resulting strength of the field gradient, further, is proportional to the local spatial resolution and thus can not become 0. The aforementioned requirement, however, applies only to the slice selection direction and the readout direction, since—as already stated above—only differences between individual the phase coding steps are determining factors in phase coding direction.

The aforementioned demand with respect to the gradient of the basic field magnet in the scan volume leads to significantly simpler magnet designs and can, for example, also be achieved with a three-coil magnet. Curve 3 in FIG. 1 shows a typical magnetic field curve for a three-coil magnet. Compared to the conventional magnet design, as represented by curve 1, the magnetic field drops faster proceeding from the center; however, the drop at the edge is less. For a given drop in the field gradient $dB_0/dr$, this value can be achieved a larger radius than in the conventional design. In FIG. 1, the limit at which an adequate spatial resolution is still possible with the aforementioned condition is referenced r1 for the conventional magnet design and is referenced r2 for a simple three-coil magnet. It follows therefrom that the useable volume for a simple magnet according to the design disclosed herein is even larger than given a conventional, complicated magnet. A particular advantage of magnets according to the inventive design is that such magnets can be constructed significantly shorter.

This not only means a cost advantage in the manufacture but also enhanced patient comfort, particularly for patients who are claustrophobic. Further, the patient to be examined is more easily accessible for interventions in a short magnet, for example in the framework of interventional examinations.

Figure 2:
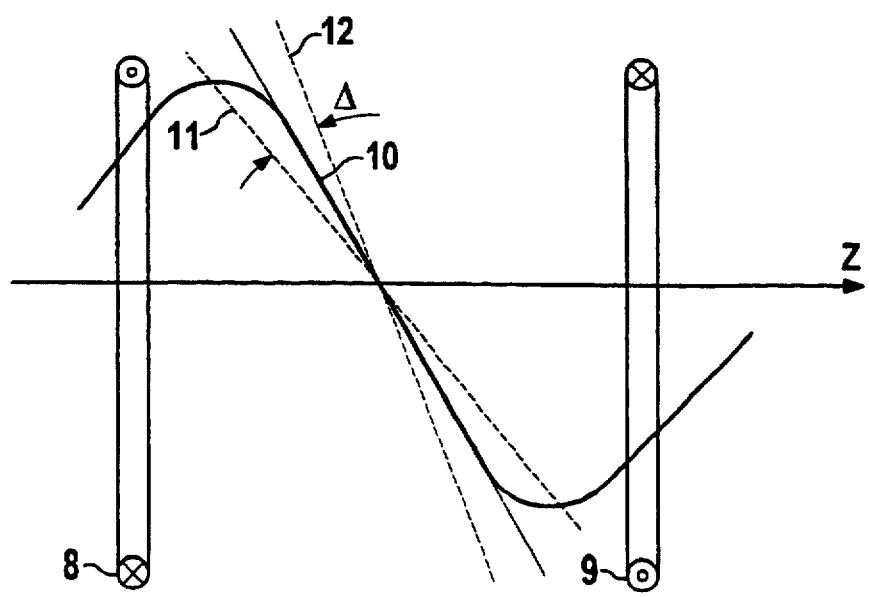
FIG. 2 schematically illustrates curve of the field of the Z-gradient coil.

FIG. 2 schematically shows a gradient coil for the z-direction, i.e. for the direction of the principal component of the basic field magnet. This is composed of the windings 8 and 9. The field generated by this gradient coil is indicated by the curve 10. The field gradient of the z-gradient coil $dB_{0z}/dz$, which typically exhibits a value of approximately 20 mT/m, is thereby relatively constant over a large part of the measuring space. The possible deviation of the field gradient between the two lines 11 and 12 is referenced Δ and, for example, amounts to a value of 10%. To avoid this system-conditioned error having significantly increased due to basic field inhomogeneities, the field gradient $dB_{0z}/du$ of the basic magnetic field is advantageously not only smaller then the gradient $dB_{0z}/dc$ generated with the gradient coils but is also kept smaller than the error of the field gradient of the z-gradient coil, i.e. less than 2 mT/m in the exemplary embodiment shown by way of example. This consideration, of course, is also true of the readout gradient.

Moreover, location errors caused by field inhomogeneities, which lead to a distortion of the acquired image, can be compensated in the image reconstruction insofar as the field inhomogeneity is known. To this end, a two-dimensional or, three-dimensional Fourier transformation is implemented over the acquired signals, and the image acquired in this way is distortion-corrected by interpolation on the basis of the pixel offset known the information about the field inhomogeneity curve.

Care must be exercised as to the receiver and sampling bandwidth to insure that the acquired magnetic resonance signal can still be received and interpreted in the region of the largest $B_{0z}$ inhomogeneity. This means an over-sampling of the time signal.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography system comprising a basic field magnet that generates a basic magnetic field $B_0$ having a principal component $B_{0z}$ in a z-direction of a rectangular coordinate system, gradient coils in the basic field magnet which generate time-varying field gradients $G_u$ in a direction u, an RF transmission and reception coil, and a drive and evaluation circuit for operating said basic field magnet, said gradient coils and said RF transmission and reception coil to excite nuclear spins in a selection direction in a scan volume and to read out and evaluate a magnetic resonance signal, arising from said nuclear spins, in a readout direction, said basic field magnet being designed independently of an absolute homogeneity of said basic magnetic field, to produce said basic magnetic field with a field gradient $dB_{0z}/du$ in the a scan volume that is lower in the selection direction and in the readout direction than the field gradient $G_u$ activated in these respective directions with the gradient coils.

2. A magnetic resonance tomography system according to claim 1, wherein the field gradient $dB_{0z}/du$ of the basic field magnet is lower than an error of the field gradient of the gradient coils.

3. A magnetic resonance tomography system according to claim 1 wherein said drive and evaluation circuit operates said transmission and reception coil in a reception mode with a reception and sampling bandwidth so that regions of a largest $B_0$ inhomogeneity can still be received.

4. A magnetic resonance tomography system according to claim 3, wherein said drive and evaluation circuit evaluates said magnetic resonance signal by over-sampling a time signal representing said magnetic resonance signal.

5. A magnetic resonance tomography system according to claim 1, said transmission and reception coil has a transmission bandwidth adapted to the $B_0$ inhomogeneity.

6. A magnetic resonance tomography system according to claim 1, wherein said drive and evaluation circuit evaluates said magnetic resonance signal by calculating a Fourier transformation over an entire sampled time signal representing said magnetic resonance signal, and distortion-corrects an image produced from said Fourier transformation by interpolation with a pixel offset known from a field inhomogeneity curve representing the inhomogeneity of $B_0$.

* * * * *